United States Patent [19]

Zeitraeg

[11] Patent Number: 4,467,318
[45] Date of Patent: Aug. 21, 1984

[54] PROCESS FOR CONVERTING LINEAR CODED PCM WORDS INTO NON-LINEAR CODED PCM WORDS AND VICE VERSA

[75] Inventor: Rolf Zeitraeg, Munich, Fed. Rep. of Germany

[73] Assignee: Siemens Aktiengesellschaft, Berlin & Munich, Fed. Rep. of Germany

[21] Appl. No.: 340,294

[22] Filed: Jan. 18, 1982

[30] Foreign Application Priority Data

Feb. 9, 1981 [DE] Fed. Rep. of Germany ....... 3104528

[51] Int. Cl.³ ............................................ H03K 13/24
[52] U.S. Cl. ............................. 340/347 DD; 375/25
[58] Field of Search .................. 340/347 DD; 375/25, 375/30

[56] References Cited

U.S. PATENT DOCUMENTS

| | | | |
|---|---|---|---|
| 3,575,951 | 4/1971 | Montrouge et al. | 235/168 |
| 3,755,808 | 8/1973 | Candiani | 340/347 DD |
| 3,789,392 | 1/1974 | Candiani | 340/347 DD |

FOREIGN PATENT DOCUMENTS

2938984 4/1981 Fed. Rep. of Germany .

*Primary Examiner*—T. J. Sloyan
*Attorney, Agent, or Firm*—Hill, Van Santen, Steadman & Simpson

[57] ABSTRACT

A process for converting linear coded PCM words into non-linear coded PCM words, and vice-versa, in accordance with a multiple segment curve which obeys the $\mu$-law provides that, in the case of relationships which obey the A-law between a non-linear coded PCM word and a linear coded PCM word it is known to use a shift register and a counter, and, as with the $\mu$-law, relationships change from segment-to-segment of the curve, in accordance with the intention, in order that this relatively simple mode of operation may be maintained, and in the case of linearization, prior to input into the shift register, every PCM word which is to be converted is added to a segment-individual bit combination, and in the case of companding, the PCM words which are to be converted, are each added to a bit combination which is dependent on whether the PCM word in question has a positive or negative sign. The PCM words which have a negative sign are represented by a two's complement of the corresponding PCM word which has a positive sign.

2 Claims, 2 Drawing Figures

FIG.1

| | $2^{12}$ $2^{11}$ $2^{10}$ $2^9$ $2^8$ $2^7$ $2^6$ $2^5$ $2^4$ $2^3$ $2^2$ $2^1$ $2^0$ | | VZ X Y Z / $2^7$ $2^6$ $2^5$ $2^4$ $2^3$ $2^2$ $2^1$ $2^0$ |
|---|---|---|---|
| | 0 $\bar{d}$ $\bar{c}$ $\bar{b}$ $\bar{a}$ 0 0 0 1 1 1 1 1 <br> +1 0 0 0 0 1 0 | VIII | 1 0 0 0 d c b a |
| | 0 0 $\bar{d}$ $\bar{c}$ $\bar{b}$ $\bar{a}$ 0 0 1 1 1 1 <br> +1 0 0 0 0 0 1 | VII | 1 0 0 1 d c b a |
| | 0 0 0 $\bar{d}$ $\bar{c}$ $\bar{b}$ $\bar{a}$ 0 0 0 1 1 1 <br> +0 1 1 1 1 1 1 | VI | 1 0 1 0 d c b a |
| | 0 0 0 0 $\bar{d}$ $\bar{c}$ $\bar{b}$ $\bar{a}$ 0 0 1 1 <br> +0 1 1 1 1 0 1 | V | 1 0 1 1 d c b a |
| | 0 0 0 0 0 $\bar{d}$ $\bar{c}$ $\bar{b}$ $\bar{a}$ 0 0 1 <br> +0 1 1 1 0 1 1 | IV | 1 1 0 0 d c b a |
| | 0 0 0 0 0 0 $\bar{d}$ $\bar{c}$ $\bar{b}$ $\bar{a}$ 0 0 0 <br> +0 1 1 0 0 1 1 | III | 1 1 0 1 d c b a |
| | 0 0 0 0 0 0 0 $\bar{d}$ $\bar{c}$ $\bar{b}$ $\bar{a}$ 0 0 0 <br> +0 1 0 0 0 1 1 | II | 1 1 1 0 d c b a |
| | 0 0 0 0 0 0 0 0 $\bar{d}$ $\bar{c}$ $\bar{b}$ $\bar{a}$ 0 0 0 <br> +0 0 0 0 0 1 1 | I | 1 1 1 1 d c b a |
| | 0 d c b a 0 0 0 0 0 0 0 1 <br> +0 0 0 0 0 1 0 1 | VIII | 0 0 0 0 d c b a |
| | 1 0 d c b a 0 0 0 0 0 0 1 <br> +0 0 0 0 1 1 0 | VII | 0 0 0 1 d c b a |
| | 1 1 0 d c b a 0 0 0 0 0 1 <br> +0 0 0 1 0 0 0 | VI | 0 0 1 0 d c b a |
| | 1 1 1 0 d c b a 0 0 0 0 1 <br> +0 0 0 0 1 1 0 0 | V | 0 0 1 1 d c b a |
| | 1 1 1 1 0 d c b a 0 0 0 1 <br> +0 0 1 0 1 0 0 | IV | 0 1 0 0 d c b a |
| | 1 1 1 1 1 0 d c b a 0 0 0 <br> +0 0 1 0 0 1 0 0 | III | 0 1 0 1 d c b a |
| | 1 1 1 1 1 1 0 d c b a 0 0 <br> +0 1 0 0 0 1 0 0 | II | 0 1 1 0 d c b a |
| | 1 1 1 1 1 1 1 0 d c b a 0 0 <br> 1 0 0 0 1 0 0 | I | 0 1 1 1 d c b a |

PROCESS FOR CONVERTING LINEAR CODED PCM WORDS INTO NON-LINEAR CODED PCM WORDS AND VICE VERSA

BACKGROUND OF THE INVENTION

1. Field of the Invention

The present invention relates to a process for converting linear coded pulse code modulated (PCM) words into non-linear coded PCM words (companding) and vice versa for converting non-linear coded PCM words into linear coded PCM words (linearization) in accordance with a multiple segment curve, employing a shift register into which, in the event of companding, a linear coded PCM word is input and is shifted therein until a significant bit appears at the series output of the shift register, whereupon, in order to form the non-linear coded PCM words, those bit combinations which characterize the number of shift clock pulses required for this purpose are used as higher-value word components, and a number of bits which follow the aforementioned significant bit and which are contained in the shift register are used as lower-value word components, and in the event of linearization, the lower-value word component, which corresponds to the grading within the segments of the aforementioned curve, of a non-linear coded PCM word is input and is shifted therein by a number of positions which is linked to the particular segment number of the curve designated by that part of the non-linear coded PCM word which has not been taken into consideration, whereupon, with a value changed in this manner, it is used to form the higher-value component of the linear coded PCM word.

2. Description of the Prior Art

The type of conversion mentioned above of linear code representations into non-linear code representations and vice-versa is of particular interest in the context of the digital switching of conference conversations in the course of which sum code words must be formed from the PCM words which are supplied by the individual conference subscribers and which, in the interest of constant signal-to-noise ratio, must possess non-linear code representation. However, this sum formation produced conclusive results only when the individual PCM words which are to be added have previously been subjected to linearization. The further transmission of the sum code word must then be preceded by a reconversion into non-linear code representation.

In terms of storage expense required for its implementation, the above mentioned process (German Offenlegungsschrift No. 1,803,222 corresponding to U.S. Pat. No. 3,575,591 and fully incorporated herein by this reference) has advantages in comparison to a process based on storing the assignment of non-linear coded PCM words to linear coded PCM words even if two proposed process variants (German patent application No. P 29 38 984.2 corresponding to U.S. Ser. No. 178,531 filed Aug. 15, 1980 and the German patent application No. P 30 28 726.4) are adopted which lead, in essence, to a reduction in the storage space requirement in comparison to the normal situation in which the assignment to a non-linear coded word is stored for each linear coded value.

The conversion procedure referred to above is based on a 13-segment curve which obeys the so-called A-law and which, because of its regularity, is particularly suitable for such conversion since, apart from the first segment in one-half of the curve, the conversions can be carried out in both directions in that at least one part of the PCM word which is to be converted is input into a shift register and, depending upon the direction of conversion, is shifted therein in dependence upon the segment upon which the value represented by the PCM word in question is located, or else is shifted until a bit possessing a specific value occurs at the shift register output, whereupon the bits which have been shifted in this manner, in their modified values and possibly together with a bit combination corresponding to the number of shifts, form the recoded PCM word. As indicated above, this procedure is not possible in the case of PCM words which are assigned to the first segment of one-half of the curve. If such PCM words are to be subjected to conversion, instead, depending upon the direction of the conversion, further specified bit combinations are attached to the bits of the non-linear coded PCM words or individual bit values within a linear coded PCM word which is to be converted are suppressed.

In the PCM time division multiplex (TDM) systems which have been introduced in various countries, the digital/analog conversion is based on the so-called $\mu$-law which differs from the above-mentioned A-law in that the relationship between non-linear coded values and coded values is not governed by 13-segment curve but by a 15-segment curve. In this case, the 128 non-linear coded values are opposed by twice as many linear coded values as in the case of the A-law, namely 8159, and, furthermore, the relationship between non-linear coded values and linear coded values is not as clearly systemized as in the case of the A-law, apart from the lowest value segment of the two curve halves.

If, in order to take into account the absence of systemization, the conversion from one form of coding into the other were approached along the lines corresponding to the A-law of treating PCM words located in the first segment of one-half of the curve in the same manner as PCM words located in the other segments, this would constitute a relatively unstructured system which could be achieved only with a relatively high technical expense.

SUMMARY OF THE INVENTION

Therefore, it is the object of the present invention to provide a process for the conversion of linear coded PCM words into non-linear coded PCM words and vice versa for the conversion of non-linear coded PCM words into linear coded PCM words which operates in accordance with the principle referred to above and which can be executed with a tolerable expense, even when the conversions are to be carried out in accordance with a relationship governed by the $\mu$-law.

According to the invention, the above object is realized in that in the event of companding, prior to input into the shift register, the linear coded PCM words which are to be converted which possess a positive sign are added up to a specific bit combination, and the PCM words which are to be converted and which possess a negative sign, and which are represented as a two's complement of the corresponding PCM word possessing a positive sign, are added to another specific bit combination, and following the corresponding shift of the sum code word formed in this manner, the non-linear coded PCM word is formed from the bit combination which indicates the number of required shift clock pulses and the complement of the bits which follow that bit which is significant as regards the shift process and which are contained in the shift register. Furthermore, in the event of linearization, prior to input into the shift register, in the case of a non-linear coded PCM word possessing a positive sign, the lower-value component which corresponds to the grading within a segment is added in complementary form to a segment-individual bit combination and it is provided that those stages of the shift register which, following the shift of the resultant sum code word, have been released or have not yet been reached—where these are assigned to the higher-bit value positions—correspond to the binary value "0", and—where these are assigned to the lower-bit positions—are set in accordance with the binary "1". In addition, prior to input into the shift register in the event of a non-linear coded PCM word possessing a negative sign, the lower-value component which corresponds to the grading within a segment is added in original form to another segment-individual bit combination and it is provided that those stages of the shift register which, following the shift of the resultant sum code word, have been released or have not been reached by bits thereof, are set in accordance with the binary value "1" where they are assigned to the higher-value bit positions, and are set in accordance with the binary value "0" where they are assigned to the lower-value bit positions, excluding the stage which is assigned to the lowest value bit positions and which is set in accordance with the binary value "1".

The process according to the present invention means that following the segment-individual additions, the conversions from one form of code representation into the other are based on simple shift and counting processes as in the case of the A-law.

In accordance with another feature of the invention, a process is provided which can be achieved particularly simply in terms of control technology.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a code table illustrating the relationship between non-linear code PCM words and linear coded PCM words in accordance with the $\mu$-law.

DESCRIPTION OF THE PREFERRED EMBODIMENTS

Figure 2:
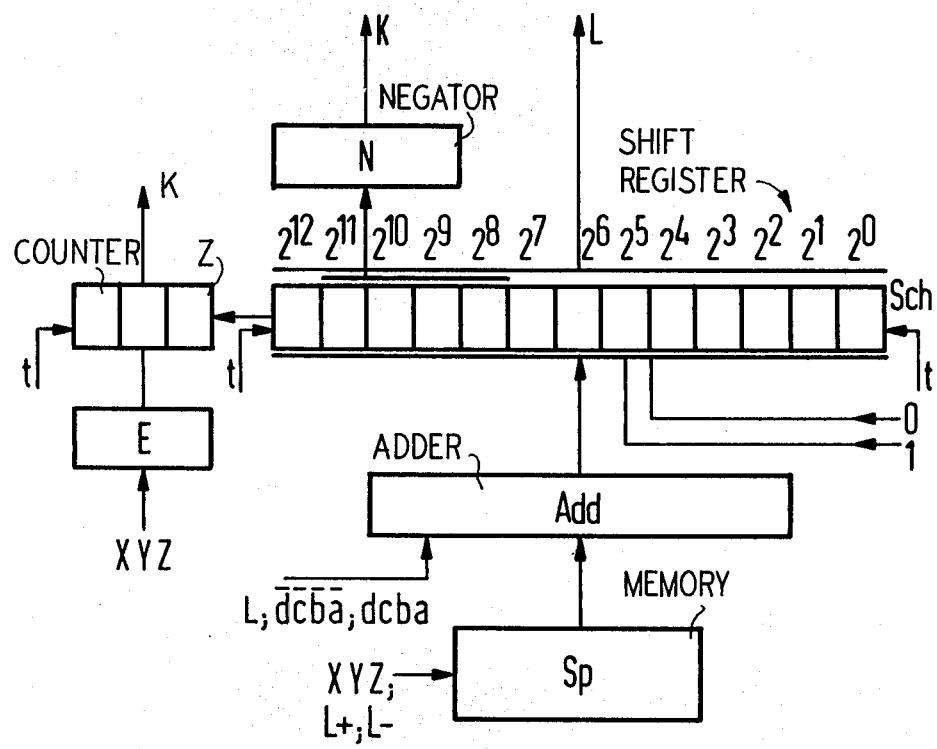
FIG. 2 is a block circuit diagram of a circuit arrangement for implementing the process of the present invention.

The arrangement illustrated in FIG. 2 for implementing the process in accordance with the invention and which has been illustrated only to the extent necessary to explain the invention, comprises, as its basic feature, a shift register Sch which, under the assumption that linear coded PCM words are to be represented using 13 bits, comprises 13 shift register stages designated by the values $2^0$–$2^{12}$. A further component of this arrangement is a counter Z which, assuming a curve composed of 15 segments—such as the blank curve, possesses 3 stages and thus is capable of counting up to 8 which is sufficient since PCM words assigned to different curve halves are treated separately and only 8 differentiatable segments occur in respect of each half of the curve. This counter is set up via a device E in a manner which will be discussed below.

Another component of the arrangement of FIG. 2 is an adder Add which, depending upon the nature of the code conversion, is supplied with components of the non-linear coded PCM words in original form or in complementary form, as indicated by the designations dcba and $\overline{dcba}$ at one of its inputs, or else the linear coded PCM word which is to be converted is supplied for which reason this input is also referenced K. A further part of the illustrated arrangement is a memory Sp which stores specific bit combinations which, as will be explained below, are called up in accordance with the operating conditions and supplied, in each case as a second input value, to the adder Add. The sum code words formed by the adder are transferred to the aforementioned shift register Sch.

In the following, and making reference to FIG. 1, a detailed explanation will be given of the processes which take place in the implementation of the process of the present invention in the coding of PCM words of one code type into the other.

In accordance with the $\mu$-law, FIG. 1 illustrates the relationships between marked PCM words in non-linear code representation and PCM words in linear code representation.

The non-linear coded PCM words which are assembled under K in the right-hand portion of FIG. 1, each possess 8 bits which are assigned the values $2^0$–$2^7$. As will be seen by comparing the representation of positive PCM words in the upper half of the drawing with corresponding negative PCM words in the lower half of the drawing, the highest value bit $2^7$ of these PCM words indicates the sign of the relevent PCM words and accordingly will be referred to as VZ in the following. The bits which follow in value, the bits $2^6$–$2^4$ of the non-linear coded PCM words which in the following will be referred to as XYZ, indicate the number of that segment of the curve on which the PCM word in question is located. The remaining bits $2^3$–$2^0$ designate the number of the quantization slot within a segment which here relates to 16 such quantization slots. As can be seen from the left-hand portion of FIG. 1 under L, the non-linear coded PCM words are each composed of a basic word comprising 13 bits and an additional word comprising 8 bits. The separate representation of basic word and additional word was selected in order to illustrate that a system governs the correspondence between the bits $2^3$–$2^0$ and dcba of the non-linear coded code words which, as mentioned, indicate the quantization stages within a segment, and the corresponding bits of the linear coded PCM words. The bit combinations possessed by the bits dcba in the non-linear coded PCM words in fact occur—where these are positive PCM words—in inverted form, and, where these are negative PCM words, re-occur in original form in the corresponding linear coded PCM word, but with different position values from segment-to-segment. Therefore, for example, a non-linear coded PCM word located in segment VIII in FIG. 1, thus in the uppermost line, which indicates a specific combination dcba of the bit positions which possess the value $2^3$–$2^0$, is assigned a linear coded PCM word in the case of which—provided the aforementioned additional word is initially disregarded—the aforementioned bit combination occurs in inverted form, namely $\overline{dcba}$, in the bit positions prossessing the values $2^{11}$–$2^8$. In the case of a non-linear coded PCM word of the second segment, the inverted bit combination $\overline{dcba}$ occurs in the bit positions $2^5-2^2$.

The illustration of the linear coded PCM words in FIG. 1 also shows that, the lowest number of the segment to which the PCM word is assigned, the more higher-value bit positions no longer contribute to the formation of the linear value—therefore here "0" is entered, and the higher the number of the segment on which the PCM word is located, the more different combinations of bits are possible on lower-value bit positions—accordingly, here the binary value "1" is entered—which corresponds to one and the same non-linear coded PCM word. This corresponds to the state in which, in the case of the $\mu$-law, the 16 different non-linear coded PCM words—where these are located on the eighth segment—are opposed by 256 linear coded PCM words, but where they are located on the seventh segment, are opposed by half as many, thus 128 linear coded PCM words etc, so that when they are located on the second segment they are opposed by four linear coded PCM words. As regards the first segment, this system is interrupted inasmuch as 15 non-linear coded PCM words are opposed by two linear coded PCM words, and the lowest-value non-linear coded PCM word is opposed by one linear coded PCM word.

The lower half of FIG. 1 illustrates corresponding conditions, if it is taken into account that here the linear coded PCM words are represented in the form of a two's complement, as will be discussed further along in this description.

There will now follow a detailed description of the processes which take place, in the conversion corresponding to the invention, of PCM words of one code type into the other. Firstly, the conversion of positive, linear coded PCM words into non-linear coded PCM words—i.e. companding, will be discussed. For this purpose, before the PCM word which is to be converted is input into the shift register Sch, to it there is added a fixed quantity whose value is dependent upon whether this is a PCM word having a positive sign or a PCM word having a negative sign, and on the basis of the regulations governed by the $\mu$-symbol-law (see CCITT ORANGE BOOK Vol. III-2, Geneva 1977, pp. 411 and 412) this value corresponds to the decimal number 32. Accordingly, the PCM word which is to be converted is fed to the adder Add as indicated by the designation K at the one adder input, and on the basis of the positive sign from the memory Sp, indicated by the designation L+ at its control input, a bit combination is called up which corresponds to the decimal number 32 and is supplied to the second input of the adder. At this time, the counter Z occupies the count "0". When the sum code word formed by the adder has been input into the shift register, as a result of the connection of a shift clock pulse t which also influences the adder Z it is shifted towards the left until a bit possessing the binary value "1" occurs at that output which is assigned to the shift register stage which possesses the value $2^{12}$. As can be seen from FIG. 1, in the case of linear coded PCM words, a 1-bit of this kind which is merely preceded by "0" bits at higher-value positions is located at a bit position of differing value from segment-to-segment.

In its higher-value component which indicates segment numbers on which the companded value is located, the higher-value component of the companded PCM word which corresponds to the linear coded PCM word which is to be converted is now formed by the bit combination indicated by the counter Z, thus by a number corresponding to the number of requisite shifts, and in its lower-value component is formed by the bits present in inverted form in the shift register stages which possess the value $2^{12}-2^9$, as indicated in FIG. 2 on the one hand by an output arrow K and, on the other hand, by an output arrow K which leads from the stages $2^{12}-2^9$ of the shift register Sch via negator N.

As stated above, the linear coded PCM words which possess a negative sign are represented in the form of the two's complement of corresponding PCM words possessing a positive characteristic, which is achieved in that the bits of the PCM word which possesses a positive characteristic are inverted and the value $2^0=1$ is added to the bit combination formed in this manner. This form of representation generally occurs in the preferred use of the process in accordance with the invention, namely in association with the establishment of conference connections, as in this manner the requisite subtractions of PCM words can be traced back to additions of the corresponding two's complement which leads to a simplification as regards the formation of the conference sum words. In the present example, and prior to the input of the two's complement of a linear coded PCM word into the shift register, the value 34 should be subtracted which is effected in the form of an addition of the two's complement of this value and whereby the special regulations of the $\mu$-law are taken into account that in the case of negative linear values the lower limit of the companding compartment belongs to those values described by the compartment number, whereas in the case of positive values, a linear value of this kind belongs to the value range of the next lower compartment. Therefore, and in accordance with the above-described method, a bit combination representing the two's complement of the value 34 is added in the adder Add to the two's complement of the linear coded PCM word, and the resultant sum code word is transferred into the shift register Sch. Because the negative words are represented in the form of their two's complement, the significant bit, on the appearance of which the output of the shift register stage possessing the value $2^{12}$, is monitored—as shown in the lower half of FIG. 1—is no longer a "1"-bit, but now is a "0"-bit. Otherwise, the conditions are identical to those governing the conversion of the positive linear coded PCM words.

In the following, the conversion of a non-linear coded PCM word having a positive sign into a corresponding linear coded PCM word will be described in detail. For this purpose, the lower-value component of the non-linear coded PCM word which characterizes a quantization stage within a segment is added in complementary form to the segment-individual bit combination. The bit combinations in question which are contained in the aforementioned memory Sp from where they are called up in accordance with the relevant segment number XYZ can be seen assembled in FIG. 1. Therefore, for example, when the non-linear coded PCM word is located in the segment VIII, the aforementioned component thereof is added to the bit combination 10000010, where the digit relationship illustrated in FIG. 1 should be maintained, i.e. the inverted components of the PCM word $\overline{dcba}$ are added to the bit positions of the second highest to fourth highest values of the aforementioned bit combinations. If, on the other hand, the non-linear PCM word which is to be converted is located, for example, in the segment II, the bit combination 01000011 should be added.

The sum code word which results from this addition is then input from the adder Add into the shift register Sch and, in accordance with a preferred exemplary embodiment of the invention, is, in fact, input into those shift register stages which are assigned the values $2^{12}$–$2^5$. Then, this sum code word is shifted to the right by the complement of the number of the segment on which the non-linear code word is located. This process is controlled by the aforementioned counter Z which, prior to the start of the shift process, is set at a count corresponding to the aforementioned complement and which, when it has reached its count having been stepped on by the shift clock pulse train of the shift register, suppresses a further supply of shift clock pulses to the shift register. Following the aforementioned shift process, the higher-value shift register stages which have thus been released are set in accordance with the binary value "0", whereas those shift register stages which have not been reached by bits originally entered in the stages possessing the values $2^{12}$–$2^5$ are set in accordance with the binary value "1". The bit combination then contained in the shift register Sch represents the linear coded PCM word which corresponds to the non-linear coded PCM word which is to be converted.

In this respect it should be noted that in the illustration of FIG. 1, for reasons of clarity, the additional code words which, as described, are added to portions of the non-linear coded PCM word prior to the shift process, have been represented as an addend which has already experienced a shift which, in practice, only the sum code word undergoes.

When the non-linear coded PCM word which is to be converted possesses a negative sign, the lower-value component thereof which corresponds to a segment grading is, as a deviation from the above-described conditions, added in original form to a segment-individual bit combination which, as illustrated in FIG. 1, differs from the corresponding bit combination for PCM words which possess a positive characteristic. As a further deviation from the described conditions in the case of PCM words which possess a positive characteristic, the shift register stages which are released following the shift of the sum code word are set up in accordance with the binary value "1", and those stages of the shift register which have not been reached by the shifted bit combination, with the exception of the stage assigned to the lowest-value bit position, are set up in accordance with the binary value "0". If the segments II–VIII are concerned, this lowest-value shift register stage is set up in accordance with the binary value "1", whereas, if the segment I is concerned, it is set up in accordance with the binary value "0". The bit combination then contained in the shift register Sch represents the two's complement of the non-linear coded PCM word which is to be converted.

Although I have described my invention by reference to particular illustrative embodiments, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A process for converting linear coded PCM words into companded non-linear coded PCM words, and vice-versa linearizing non-linear PCM words, in accordance with a multiple segment curve and in accordance with a relationship governed by the $\mu$-law, comprising the steps of: in the case of companding
    adding linear coded PCM words having a positive sign to a specific bit combination and adding linear coded PCM words having a negative sign and which are represented as a two's complement of a corresponding PCM word having a positive sign to another specific bit combination to form sum code words,
    shifting a sum code word through a shift register until a significant bit appears at the series output of the shift register, and
    counting the number of shift pulses required to shift to the significant bit and defining the bit combination of such count as a higher-value word component and defining the number of bits following the significant bit and remaining in the shift register as a lower-value word component of the formed non-linear PCM code word; and
in the case of linearizing
    for non-linear PCM words having a positive sign, adding a lower-value component corresponding to a grading within a segment in complementary form to a segment-individual bit combination to form a sum code word,
    shifting the sum code word through the shift register a number of positions linked to the relevant segment number designated by that portion of the non-linear coded PCM word not taken into consideration and defining the same as a higher-value component of the linear coded PCM word, and setting those stages of the shift register which have been released and those stages which have not been reached during shifting to a binary 0 when they are assigned to the higher-value bit positions and to a binary 1 when they are assigned to low-value bit positions, and
    for non-linear coded PCM words having a negative sign, adding a lower-value component corresponding to a grading within a segment to another segment-individual bit combination, shifting the sum code word through the shift register a number of positions linked to the relevant segment number designated by that portion of the non-linear coded PCM word not taken into consideration and defining the same as a higher-value component of the linear coded PCM word, and setting those stages of the shift register which have been released and those stages which have not been reached during shifting to a binary 1 when they are assigned to higher-value bit positions and to a binary 0 when they are assigned to lower-value bit positions, except the lowest value bit position stage is always set to a binary 0 when that corresponding segment is concerned and to a binary 1 when the other segments are concerned.

2. The process of claim 1, and further defined by the steps of:
    inputting the sum code words into the shift register stages assigned to the highest bit position values; and
    shifting the sum code words in the direction of the lower bit position values by as many positions as designated by the complement of the bit combination which indicates the segment number of the respective non-linear coded PCM word.

* * * * *